United States Patent [19]

Imamura et al.

[11] 4,152,486
[45] May 1, 1979

[54] MAGNETO-OPTICAL MEMORY MEDIUM

[75] Inventors: Nobutake Imamura, Meguro; Yoshinori Mimura, Tachikawa; Toshihiko Kobayashi, Mitaka, all of Japan

[73] Assignee: Kokusai Denshin Denwa Kabushiki Kaisha, Japan

[21] Appl. No.: 776,251

[22] Filed: Mar. 10, 1977

[30] Foreign Application Priority Data

Mar. 11, 1976 [JP] Japan .................................. 51-25534

[51] Int. Cl.$^2$ .............................................. C22C 38/00
[52] U.S. Cl. .................................. 428/606; 75/123 E; 75/153; 148/31.55; 148/108
[58] Field of Search .................. 75/123 E, 153, 123 R; 148/100, 103, 108, 31.55; 428/606

[56] References Cited

U.S. PATENT DOCUMENTS

| | | | |
|---|---|---|---|
| 3,409,479 | 11/1968 | Greenberg et al. | 148/108 |
| 3,427,154 | 2/1969 | Mader et al. | 148/31.55 |
| 3,856,513 | 12/1974 | Chen et al. | 75/123 R |
| 3,949,351 | 4/1976 | Clark et al. | 75/152 |
| 4,053,332 | 10/1977 | Egami | 45/123 D |

OTHER PUBLICATIONS

"Constitution of Binary Alloys, First Supplement"; Elliott, 1965, p. 392.
"Magnetism and Magnetic Materials–1975", AIP, "Magnetic Core Loss and Internal Stress in Metallic Glasses," O'Handley.
Nesbitt, E. et al.; *Magnetic Moments of Compounds of Transition and Rare Earth Elements*, in *Journ. Appl. Phys.*, 33, May, 1962, pp. 1674–1678.

*Primary Examiner*—Arthur J. Steiner
*Attorney, Agent, or Firm*—Robert E. Burns; Emmanuel J. Lobato; Bruce L. Adams

[57] ABSTRACT

A magneto-optical memory medium having an easy axis of magnetization perpendicular to the medium surface. The memory medium is formed by an amorphous Dy-Fe system alloy film containing 18 to 28 atom % Dy.

2 Claims, 2 Drawing Figures

MAGNETO-OPTICAL MEMORY MEDIUM

FIELD OF THE INVENTION

This invention relates to a magneto-optical memory medium for use in magneto-optical storage and, more particularly, to a magneto-optical memory medium, which has an easy axis of magnetization in a direction perpendicular to the medium surface and is irradiated by a laser or like light beam to be locally heated to cause reversal of magnetization in the irradiated area to perform storage of information.

DESCRIPTION OF THE PRIOR ART

Generally, a magnetic thin film, which has an easy axis of magnetization in a direction perpendicular to the film surface and has a Curie point higher than the room temperature, can be used as a magneto-optical memory medium of high density. At present, there are known, as such magneto-optical memory media, magnetic thin films as of MnBi, MnAlGe, etc. and amorphous films represented by Tb-Fe. In these magnetic thin films, the amorphous film such as Tb-Fe is amorphous unlike a polycrystalline film, and hence is unaffected by crystal particles, and it is known that the amorphous film has such advantages that a signal of good SN ratio can be obtained and that the film can be formed on a desired substrate. However, the amorphous film presents a problem in its thermal stability. Namely, the amorphous state is not a structurally stable state but a metastable state, so that when the temperature of the amorphous film has been raised by heating, the film is crystallized unreversible to destroy the content stored therein. In practice, in amporphous alloys composed of rare earth elements and transition metals such as Tb-Fe and Dy-Fe, such crystallization occurs at a temperature of about 300° C. Therefore, for repeatedly effecting stable write and erase operations in the amorphous magneto-optical memory medium, it is highly desired to develop a memory medium of low Curie point which enables write and erase operations at a temperature as low as possible, but a medium of suitable characteristics has not yet been developed.

SUMMARY OF THE INVENTION

An object of this invention is to provide a magneto-optical memory medium of low Curie point, which is free from such thermal unstability peculiar to the amorphous magneto-optical memory medium as mentioned above and is effective for miniaturization of a magneto-optical storage.

The magneto-optical memory medium of this invention is an amorphous alloy film of Dy and Fe, which has both a uniaxial magnetic anisotropy and an easy axis of magnetization in a direction perpendicular to the film surface and has a Curie point in the range of 50° to 100° C. To provide sufficient magnetic anisotropy in the direction perpendicular to the film surface, it is necessary to make the thin film amorphous, but this can be achieved to produce the thin film by sputtering or vacuum-evaporating on a substrate held at a temperature below the room temperature. Further, in order to establish an easy axis of magnetization perpendicular to the film surface, the film thickness is required to be more than 500° Å. Moreover, to obtain the Curie point in the range of 50° to 100° C., the composition of Dy and Fe is required to be limited to the range of 18 to 28 atom % Dy. Since the magneto-optical memory medium of this invention has an easy axis of magnetization in the direction perpendicular to the film surface, it is possible to achieve storage of information at the very high density.

The magneto-optical memory medium of this invention has a low Curie temperature of about 70° C. The Curie temperatures of crystalline Dy-Fe alloys are 524° C., for example, in the case of $Dy_6Fe_{23}$ and 600° C. in the case of $DyFe_3$, and are apparently appreciably higher than the room temperature. However, in the magneto-optical memory medium of this invention, a low Curie temperature 70° C. is achieved by making the Dy-Fe alloy amorphous.

BRIEF DESCRIPTION OF THE DRAWINGS

The principle and construction of this invention will be clearly understood from the following delailed description taken in conjunction with the accompanying draings, in which.

DESCRIPTION OF THE PREFERRED EMBODIMENTS

Figure 1:
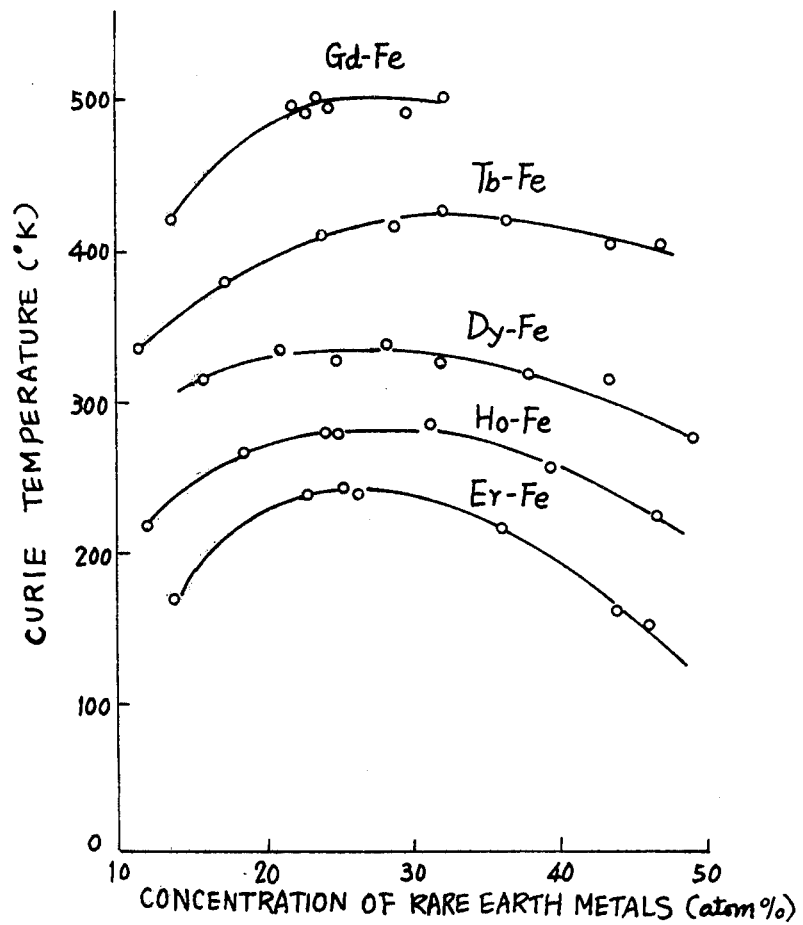
FIG. 1 is a graph showing characteristics of Dy-Fe amorphous alloy film of this invention and of other amorphous alloy films composed of rare earth metals and iron.

FIG. 1 shows the results of measurement for Curie temperatures of a series of amorphous alloy films, which is formed by rare earth metals and iron, including the magneto-optical storing medium. Since amorphous films of Ho-Fe, Er-Fe, etc. have Curie points lower than the room temperature, they cannot be employed as magnetic memory media at the room temperature. Accordingly, as is evident from FIG. 1, the magneto-optical memory medium of this invention, that is, the amorphous Dy-Fe film, is lower in the Curie point than any other amorphous alloy films of the rare earth metals and iron in practice, and has low composition dependence of the Curie point.

Figure 2:
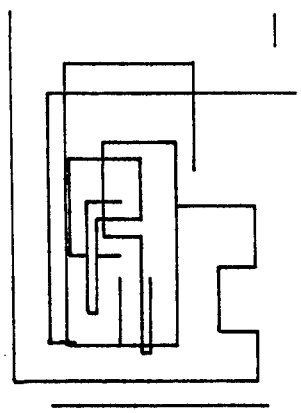
FIG. 2 is a diagram illustrating an example of measurement, by a polarizing microscope, of a magnetic domain pattern stored in the magneto-optical memory medium of this invention.

As described above, the magneto-optical memory medium of this invention has a low Curie point of about 70° C., so that information can be stored in the medium by the small laser power. In FIG. 2, there is shown an example of information written by a laser power of 0.7 mW and then read out by a polarizing microscope utilizing the Polar Kerr effect. The widths of illustrated lines are about 2 $\mu$m. The laser power of such a value is readily obtainable by a semiconductor laser placed on the market, and is very advantageous for miniaturization of the magneto-optical storage. Moreover, since write and erase operations can be effected utilizing the low Curie point, the memory medium of this invention is also thermally stable.

As has been described in the foregoing, the magneto-optical memory medium has an easy axis of magnetization in the direction perpendicular to the film surface and has a Curie point of about 70° C., so that when it is employed as a memory medium of a magneto-optical storage of the type in which write and read operations are achieved by a light beam, it is possible to realize a magneto-optical storage, which is capable of high-density recording of information with a small laser power. Further, since a semiconductor laser can be used for the write operation, the very small magneto-optical storage can be obtained. Moreover, since write and erase operations can be effected by utilizing the low Curie point, the magneto-optical memory medium of this invention can be used as a stable memory medium which does not cause any structural change due to heat.

What we claim is:

1. A magneto-optical memory medium having as easy axis of magnetization perpendicular to a medium surface, comprising: an amorphous alloy having a Curie point of about 70° C.; said amorphous alloy consisting essentially of 18 to 28 atomic % Dy and the balance Fe.

2. A magneto-optical memory medium according to claim 1 in the form of a film having a thickness greater than 500Å.